(12) United States Patent
Fjelstad

(10) Patent No.: US 8,482,110 B2
(45) Date of Patent: Jul. 9, 2013

(54) ELECTRONIC ASSEMBLIES WITHOUT SOLDER AND METHODS FOR THEIR MANUFACTURE

(75) Inventor: Joseph C. Fjelstad, Maple Valley, WA (US)

(73) Assignee: OCCAM Portfolio LLC, Cupertino, CA (US)

(*) Notice: Subject to any disclaimer, the term of this patent is extended or adjusted under 35 U.S.C. 154(b) by 0 days.

(21) Appl. No.: 13/185,323

(22) Filed: Jul. 18, 2011

(65) Prior Publication Data

US 2012/0006589 A1    Jan. 12, 2012

Related U.S. Application Data

(60) Division of application No. 12/191,544, filed on Aug. 14, 2008, now Pat. No. 7,981,703, which is a continuation of application No. PCT/US2008/065131, filed on May 29, 2008, which is a continuation-in-part of application No. PCT/US2008/063123, filed on May 8, 2008.

(60) Provisional application No. 60/966,643, filed on Aug. 28, 2007, provisional application No. 61/038,564, filed on Mar. 21, 2008, provisional application No. 61/039,059, filed on Mar. 24, 2008, provisional application No. 60/932,200, filed on May 29, 2007, provisional application No. 60/958,385, filed on Jul. 5, 2007, provisional application No. 60/959,148, filed on Jul. 10, 2007, provisional application No. 60/962,626, filed on Jul. 31, 2007, provisional application No. 60/963,822, filed on Aug. 6, 2007.

(51) Int. Cl.
*H01L 21/00* (2006.01)

(52) U.S. Cl.
USPC ............ 257/668; 257/687; 438/15; 438/125; 438/455

(58) Field of Classification Search
USPC ............ 257/668, 687; 438/15, 455, 125
See application file for complete search history.

(56) References Cited

U.S. PATENT DOCUMENTS

| | | | |
|---|---|---|---|
| 4,635,356 A | | 1/1987 | Ohuchi |
| 5,734,555 A | * | 3/1998 | McMahon ............... 361/704 |
| 5,903,439 A | * | 5/1999 | Tamarkin ............... 361/742 |
| 6,646,890 B1 | * | 11/2003 | Byers et al. ............. 361/802 |

(Continued)

OTHER PUBLICATIONS

EP Application No. 08756454.8, European Search Report dated Mar. 21, 2012.

*Primary Examiner* — Jarrett Stark
*Assistant Examiner* — Nicholas Tobergte
(74) *Attorney, Agent, or Firm* — Edward P. Heller, III

(57) ABSTRACT

The present invention provides an electronic assembly 400 and a method for its manufacture 800, 900, 1000 1200, 1400, 1500, 1600, 1700. The assembly 400 uses no solder. Components 406, or component packages 402, 802, 804, 806 with I/O leads 412 are placed 800 onto a planar substrate 808. The assembly is encapsulated 900 with electrically insulating material 908 with vias 420, 1002 formed or drilled 1000 through the substrate 808 to the components' leads 412. Then the assembly is plated 1200 and the encapsulation and drilling process 1500 repeated to build up desired layers 422, 1502, 1702. Assemblies may be mated 1800. Within the mated assemblies, items may be inserted including pins 2202a, 2202b, and 2202c, mezzanine interconnection devices 2204, heat spreaders 2402, and combination heat spreaders and heat sinks 2602. Edge card connectors 2802 may be attached to the mated assemblies.

12 Claims, 25 Drawing Sheets

U.S. PATENT DOCUMENTS

| | | | |
|---|---|---|---|
| 6,932,618 B1 * | 8/2005 | Nelson | 439/66 |
| 2003/0057544 A1 * | 3/2003 | Nathan et al. | 257/700 |
| 2007/0035015 A1 * | 2/2007 | Hsu | 257/723 |
| 2007/0102803 A1 * | 5/2007 | Gann | 257/686 |

* cited by examiner

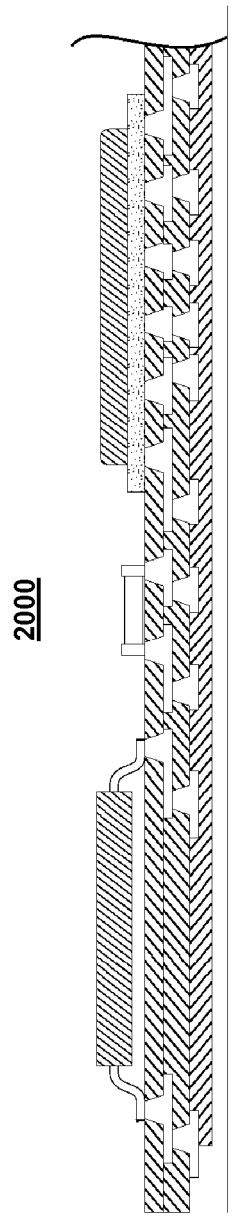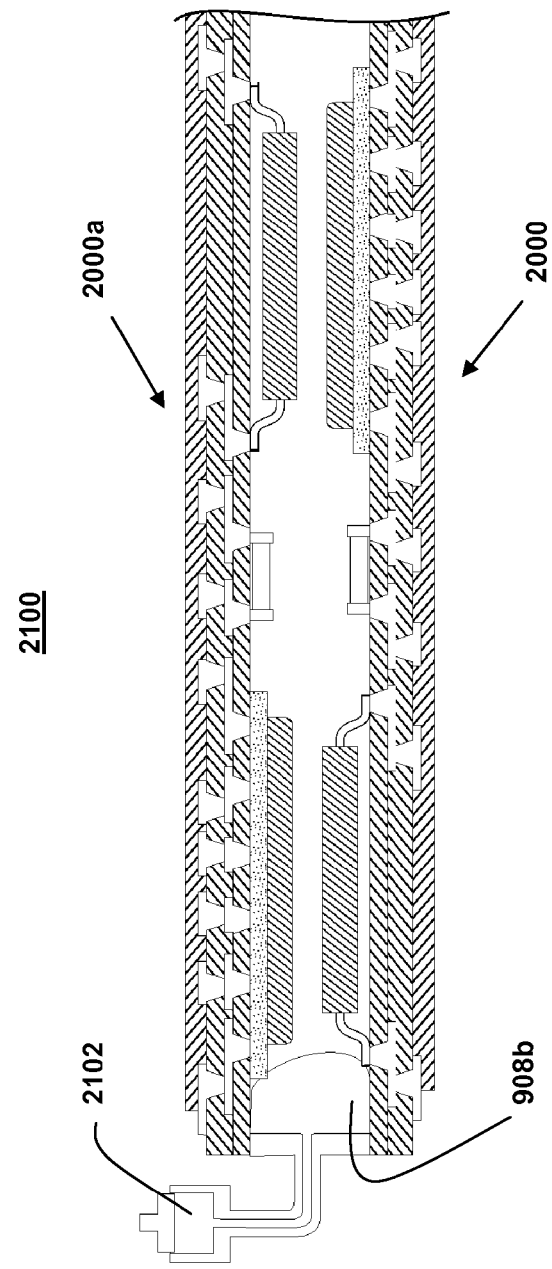

US 8,482,110 B2

ELECTRONIC ASSEMBLIES WITHOUT SOLDER AND METHODS FOR THEIR MANUFACTURE

CROSS REFERENCE TO RELATED APPLICATIONS

This application is a divisional application of U.S. patent application Ser. No. 12/191,544, filed Aug. 14, 2008, which is a continuation-in-part application, and claims benefit of, PCT/US2008/063123 entitled "ELECTRONIC ASSEMBLIES WITHOUT SOLDER AND METHODS FOR THEIR MANUFACTURE" which was filed on May 8, 2008 the priority of which is hereby claimed, and the entirety of which is incorporated herein by this reference and which claimed priority to and the benefit of U.S. Application No. 60/928,467 "ELECTRONIC ASSEMBLY WITHOUT SOLDER AND METHODS FOR THEIR MANUFACTURE" which was filed on May 8, 2007.

This application claims the benefit of PCT Application No. PCT/US2008/065131 filed on May 29, 2008 which claimed priority to: "ELECTRONIC ASSEMBLY WITHOUT SOLDER AND METHODS FOR THEIR MANUFACTURE," U.S. Application No. 60/932,200, filed on May 29, 2007; "SOLDERLESS FLEXIBLE ELECTRONIC ASSEMBLIES AND METHODS FOR THEIR MANUFACTURE," U.S. Application No. 60/958,385, filed on Jul. 5, 2007; "ELECTRONIC ASSEMBLIES WITHOUT SOLDER AND METHODS FOR THEIR MANUFACTURE," U.S. Application No. 60/959,148, filed on Jul. 10, 2007; "MASS ASSEMBLY OF ENCAPULSATED ELECTRONIC COMPONENTS TO A PRINTED CIRCUIT BOARD BY MEANS OF AN ADHESIVE LAYER HAVING EMBEDDED CONDUCTIVE JOINING MATERIALS," U.S. Application No. 60/962,626, filed on Jul. 31, 2007; "SYSTEM FOR THE MANUFACTURE OF ELECTRONIC ASSEMBLIES WITHOUT SOLDER," U.S. Application No. 60/963,822, filed on Aug. 6, 2007; "ELECTRONIC ASSEMBLIES WITHOUT SOLDER AND METHODS FOR THEIR MANUFACTURE," U.S. Application No. 60/966,643, filed on Aug. 28, 2007; "MONOLITHIC MOLDED SOLDERLESS FLEXIBLE ELECTRONIC ASSEMBLIES AND METHODS FOR THEIR MANUFACTURE," U.S. Application No. 61/038,564, filed on Mar. 21, 2008; and "THE OCCAM PROCESS SOLDERLESS ASSEMBLY AND INTERCONNECTION OF ELECTRONIC PACKAGES," U.S. Application No. 61/039,059, filed on Mar. 24, 2008.

The present application is based on and priority to and benefit of is claimed to provisional applications entitled "ELECTRONIC ASSEMBLY WITHOUT SOLDER AND METHODS FOR THEIR MANUFACTURE," U.S. Application No. 60/932,200, filed on May 29, 2007; "SOLDERLESS FLEXIBLE ELECTRONIC ASSEMBLIES AND METHODS FOR THEIR MANUFACTURE," U.S. Application No. 60/958,385, filed on Jul. 5, 2007; "ELECTRONIC ASSEMBLIES WITHOUT SOLDER AND METHODS FOR THEIR MANUFACTURE," U.S. Application No. 60/959,148, filed on Jul. 10, 2007; "MASS ASSEMBLY OF ENCAPULSATED ELECTRONIC COMPONENTS TO A PRINTED CIRCUIT BOARD BY MEANS OF AN ADHESIVE LAYER HAVING EMBEDDED CONDUCTIVE JOINING MATERIALS," U.S. Application No. 60/962,626, filed on Jul. 31, 2007; "SYSTEM FOR THE MANUFACTURE OF ELECTRONIC ASSEMBLIES WITHOUT SOLDER," U.S. Application No. 60/963,822, filed on Aug. 6, 2007; "ELECTRONIC ASSEMBLIES WITHOUT SOLDER AND METHODS FOR THEIR MANUFACTURE," U.S. Application No. 60/966,643, filed on Aug. 28, 2007; "MONOLITHIC MOLDED SOLDERLESS FLEXIBLE ELECTRONIC ASSEMBLIES AND METHODS FOR THEIR MANUFACTURE," U.S. Application No. 61/038,564, filed on Mar. 21, 2008; and "THE OCCAM PROCESS SOLDERLESS ASSEMBLY AND INTERCONNECTION OF ELECTRONIC PACKAGES," U.S. Application No. 61/039,059, filed on Mar. 24, 2008, the benefits of the filing dates which are claimed under 35 U.S.C. §119(e).

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD OF THE INVENTION

The present invention relates generally to the field of electronic assembly and more specifically, but not exclusively, to the manufacture and assembly of electronic products without the use of solder.

BACKGROUND

The assembly of electronic products and more specifically the permanent assembly of electronic components to printed circuit boards has involved the use of some form of relatively low-temperature solder alloy (e.g., tin/lead or Sn63/Pb37) since the earliest days of the electronics industry. The reasons are manifold but the most important one has been the ease of mass joining of thousand of electronics interconnections between printed circuit and the leads of many electronic components.

Lead is a highly toxic substance, exposure to which can produce a wide range of well known adverse health effects. Of importance in this context, fumes produced from soldering operations are dangerous to workers. The process may generate a fume which is a combination of lead oxide (from lead based solder) and colophony (from the solder flux). Each of these constituents has been shown to be potentially hazardous. In addition, if the amount of lead in electronics were reduced, it would also reduce the pressure to mine and smelt it. Mining lead can contaminate local ground water supplies. Smelting can lead to factory, worker, and environmental contamination.

Reducing the lead stream would also reduce the amount of lead in discarded electronic devices, lowering the level of lead in landfills and in other less secure locations. Because of the difficulty and cost of recycling used electronics, as well as lax enforcement of legislation regarding waste exports, large amounts of used electronics are sent to countries such as China, India, and Kenya, which have lower environmental standards and poorer working conditions.

Thus, there are marketing and legislative pressures to reduce tin/lead solders. In particular, the Directive on the Restriction of the Use of Certain Hazardous Substances in Electrical and Electronic Equipment (commonly referred to as the Restriction of Hazardous Substances Directive or RoHS) was adopted in February 2003 by the European Union. The RoHS directive took effect on Jul. 1, 2006, and is required to be enforced and become law in each member state. This directive restricts the use of six hazardous materials, including lead, in the manufacture of various types of electronic and electrical equipment. It is closely linked with the Waste Electrical and Electronic Equipment Directive (WEEE) 2002/96/EC which sets collection, recycling and recovery targets for electrical goods and is part of a legislative initiative to solve the problem of huge amounts of toxic electronic device waste.

RoHS does not eliminate the use of lead in all electronic devices. In certain devices requiring high reliability, such as medical devices, continued use of lead alloys is permitted. Thus, lead in electronics continues to be a concern. The electronics industry has been searching for a practical substitute for tin/lead solders. The most common substitutes in present use are SAC varieties, which are alloys containing tin (Sn), silver (Ag), and copper (Cu).

SAC solders also have significant environmental consequences. For example, mining tin is disastrous both locally and globally. Large deposits of tin are found in the Amazon rain forest. In Brazil, this has led to the introduction of roads, clearing of forest, displacement of native people, soil degradation, and creation of dams, tailing ponds, and mounds, and smelting operations. Perhaps the most serious environmental impact of mining tin in Brazil is the silting up of rivers and creeks. This degradation modifies forever the profile of animal and plant life, destroys gene banks, alters the soil structure, introduces pests and diseases, and creates an irrecoverable ecological loss.

Worldwide ecological problems stemming from mismanagement of Brazil's environment are well known. These range from pressures on global warming from the destruction of rain forest to the long term damage to the pharmaceutical industry by the destruction of animal and plant life diversity. Mining in Brazil is simply one example of the tin industry's destructive effects. Large deposits and mining operations also exist in Indonesia, Malaysia, and China, developing countries where attitudes toward economic development overwhelm concerns for ecological protection.

SAC solders have additional problems. They require high temperatures, wasting energy, are brittle, and cause reliability problems. The melting temperature is such that components and circuit boards may be damaged. Correct quantities of individual alloy constituent compounds are still under investigation and the long term stability is unknown. Moreover, SAC solder processes are prone to the formation of shorts (e.g., "tin whiskers") and opens if surfaces are not properly prepared. Whether tin/lead solder or a SAC variety is used, dense metal adds both to the weight and height of circuit assemblies.

Therefore there is a need for a substitute for the soldering process and its attendant environmental and practical drawbacks.

While solder alloys have been most common, other joining materials have been proposed and/or used such as so-called "polymer solders" which are a form of conductive adhesive. Moreover, there have been efforts to make connections separable by providing sockets for components. There have also been electrical and electronic connectors developed to link power and signal carrying conductors described with various resilient contact structures all of which require constant applied force or pressure.

At the same time, there has been a continual effort to put more electronics into ever smaller volumes. As a result, over the last few years there has been interest within the electronics industry in various methods for integrated circuit (IC) chip stacking within packages and the stacking of IC packages themselves, all with the intent of reducing assembly size in the Z or vertical axis. There has also been an ongoing effort to reduce the number of surface mounted components on a printed circuit board (PCB) by embedding certain components, mostly passive devices, inside the circuit board.

In the creation of IC packages, there has also been an effort to embed active devices by placing unpackaged IC devices directly inside a substrate and interconnecting them by drilling and plating directly to the chip contacts. While such solutions offer benefits in specific applications, the input/output (I/O) terminals of the chip can be very small and very challenging to make such connections accurately. Moreover the device after manufacturing may not successfully pass burn in testing making the entire effort valueless after completion.

Another area of concern is in management of heat as densely packaged ICs may create a high energy density that can reduce the reliability of electronic products.

SUMMARY OF THE INVENTION

The present invention provides an electronic assembly and a method for its manufacture. Pre-tested and burned in components including electrical, electronic, electro-optical, electro-mechanical and user interface devices with external I/O contacts are placed onto a planar base. This subassembly is encapsulated with a solder mask, dielectric, or electrically insulating material (collectively referred to as "insulating material" in this application including claims) with holes, known as vias, formed or drilled through to the components' leads, conductors, and terminals (collectively referred to as "leads" in this application including claims). Then the subassembly is plated and the encapsulation and drilling process repeated to build up desired layers.

Subassemblies may be mated to enable packaging components densely. In addition, layers may be electrically and physically interconnected with pins and/or mezzanine multi-path interconnection devices.

The assembly, built with a novel reverse-interconnection process (RIP), uses no solder, thus bypassing the use of lead, tin, and heat associated problems. The term "reverse" refers to the reverse order of assembly; components are placed first and then circuit layers manufactured rather than creating a PCB first and then mounting components. No conventional PCB is required (although one may be optionally integrated), shortening manufacturing cycle time, reducing costs and complexity, and lessening PCB reliability problems.

RIP products are robust with respect to mechanical shock and thermal cycle fatigue failure. As solder joints tend to be the first point of failure in electronics systems, the elimination of solder increases assembly robustness. In comparison to conventional products placed on PCB boards, components incorporated into RIP products require no standoff from the surface and thus have a lower profile and can more densely spaced. Moreover, because no solderable finish is required and fewer materials and fewer process steps are required, RIP products are lower-cost. In addition, RIP products are amenable to in-place thermal enhancements (including improved heat dissipation materials and methods) that also may provide integral electromagnetic interference (EMI) shielding. Moreover the structure may be assembled with embedded electrical and optical components and/or provided with optical pathways.

The present invention overcomes numerous disadvantages in the prior art by:
Obviation of the need for circuit boards
Obviation of the need for soldering
Obviation of the problem of "tin whiskers"

Obviation of the need for difficult cleaning between fine pitch component leads

Obviation of the need for compliant leads or compliant solder connections

Obviation of many of the problems associated with electronic waste at many different levels of manufacturing and end of life Obviation of the thermal concerns related to the use of high temperature lead-free solders on vulnerable components Benefits of the present invention include:

Low manufacturing waste, as structures are almost completely additive

Lower material use in construction

Environmentally friendly as potentially toxic metals are not needed

Fewer processing steps

Reduced testing requirements

Low heat processing, thus resulting in energy savings

Lower cost

Lower profile assemblies

Increased reliability

Potentially higher performance or longer battery life

Better protection of ICs against mechanical shock, vibration and physical damage Full shielding of the electronics as a final metal coating can be applied Improved thermal performance Integral edge card connector capable Improved design for memory modules Improved design for phone modules Improved design for computer card modules Improved design for smart and RFID cards Improved lighting modules The details of the present invention, both as to its structure and operation, and many of the attendant advantages of this invention, can best be understood in reference to the following detailed description, when taken in conjunction with the accompanying drawings, in which like reference numerals refer to like parts throughout the various views unless otherwise specified, and in which:

BRIEF DESCRIPTION OF THE DRAWINGS

FIG. 20 is a cross-sectional view of an alternate form of RIP subassembly.

FIG. 21 is a cross-sectional view of a process of injection filling of insulating material between mated RIP subassemblies.

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between conductor elements of components (i.e., component I/O leads) may be shown or described as having multi-conductors interconnecting to a single lead or a single conductor signal line connected to multiple component contacts within or between devices. Thus each of the multi-conductor interconnections may alternatively be a single-conductor signaling, control, power or ground line and vice versa. Circuit paths shown or described as being single-ended may also be differential, and vice-versa. The interconnected assembly may be comprised of standard interconnections; microstrip or stripline interconnections and all signal lines of the assembly may be either shielded or unshielded.

Figure 1:
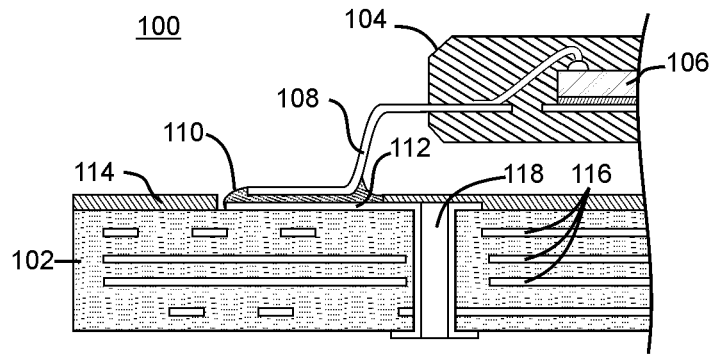
FIG. 1 is a cross-sectional view of a prior solder assembly employing a gull wing component on a PCB.

FIG. 1 shows a prior completed assembly 100, with solder joint 110, of a gull wing component package 104 solder-mounted on a PCB 102.

Component package 104 contains electrical component 106. The component 106 may be either an IC or another discrete component. Gull wing lead 108 extends from package 104 to flow solder 110 which in turn connects lead 108 to pad 112 on PCB 102. Insulating material 114 prevents flow solder 110 from flowing to and shorting component 106 with other components (not shown) on PCB 102. Pad 112 connects to through hole 118 which in turn connects to proper traces such as ones indicated by 116. In addition to the aforementioned problems with solder joints, this type of assembly, including the internal structure of PCB 102, is complex and requires height space that is reduced in the present invention.

Figure 2:
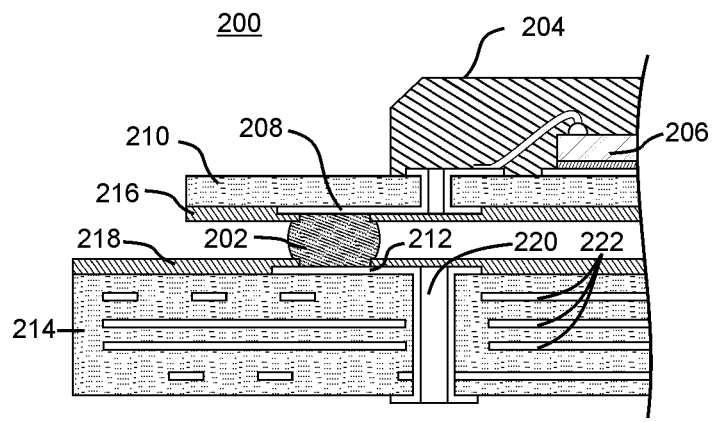
FIG. 2 is a cross-sectional view of a prior solder assembly employing either a Ball Grid Array (BGA) or a Land Grid Array (LGA) component on a PCB.

FIG. 2 shows a prior completed assembly 200, with solder joint 202, of either a BGA IC or a LGA IC package 204 on a PCB 214. A primary difference from FIG. 1 is the use of ball solder 202 as opposed to reflowed solder 110.

Component package 204 contains component 206. Lead 208 extends from package 204 through support 210 (typically composed of organic or ceramic material) to ball solder 202 which in turn connects lead 208 to pad 212 on PCB 214. Insulating material 216 prevents ball solder 202 from shorting other leads (not shown) contained in package 204. Insulating material 218 prevents ball solder 202 from flowing to and shorting component 206 with other components (not shown) on PCB 214. Pad 212 connects to through hole 220 which in turn connects to proper traces such as ones indicated by 222. The same problems are present with this configuration as with the assembly shown in FIG. 1: In addition to the aforementioned problems with solder joints, this type of assembly is complex, particularly because of the PCB 214, and requires height space that is reduced in the present invention.

Figure 3:
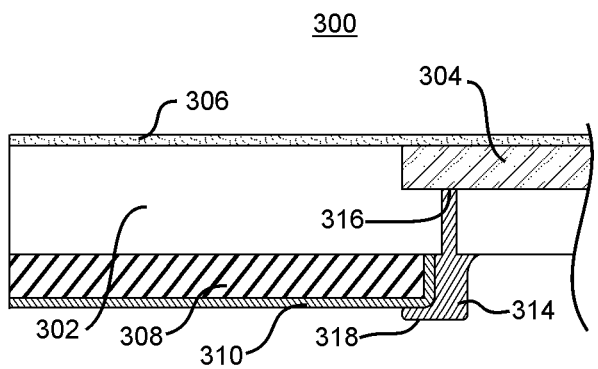
FIG. 3 is a cross-sectional view of a prior solderless assembly employing an electrical component.

FIG. 3 illustrates a prior solderless connection apparatus 300. See U.S. Pat. No. 6,160,714 (Green). In this configuration, substrate 302 supports a package 304. Package 304 contains an electrical component (not shown) such as an IC or other discrete component. Overlying substrate 302 is insulating material 306. On the other side of the substrate 302, is a conductive, polymer-thick-film ink 308. To improve conductivity, a thin film of copper is plated 310 on polymer-thick-film 308. A via extends from the package 304 through substrate 302. The via is filled with a conductive adhesive 314. The point of attachment 316 of package 304 to adhesive 314 may be made with fusible polymer-thick-film ink, silver polymer-thick-film conductive ink, or commercial solder paste. One disadvantage of this prior art assembly over the present invention is the additional thickness added by the adhesive 314 as illustrated by bump 318.

RIP Apparatus

Figure 4:
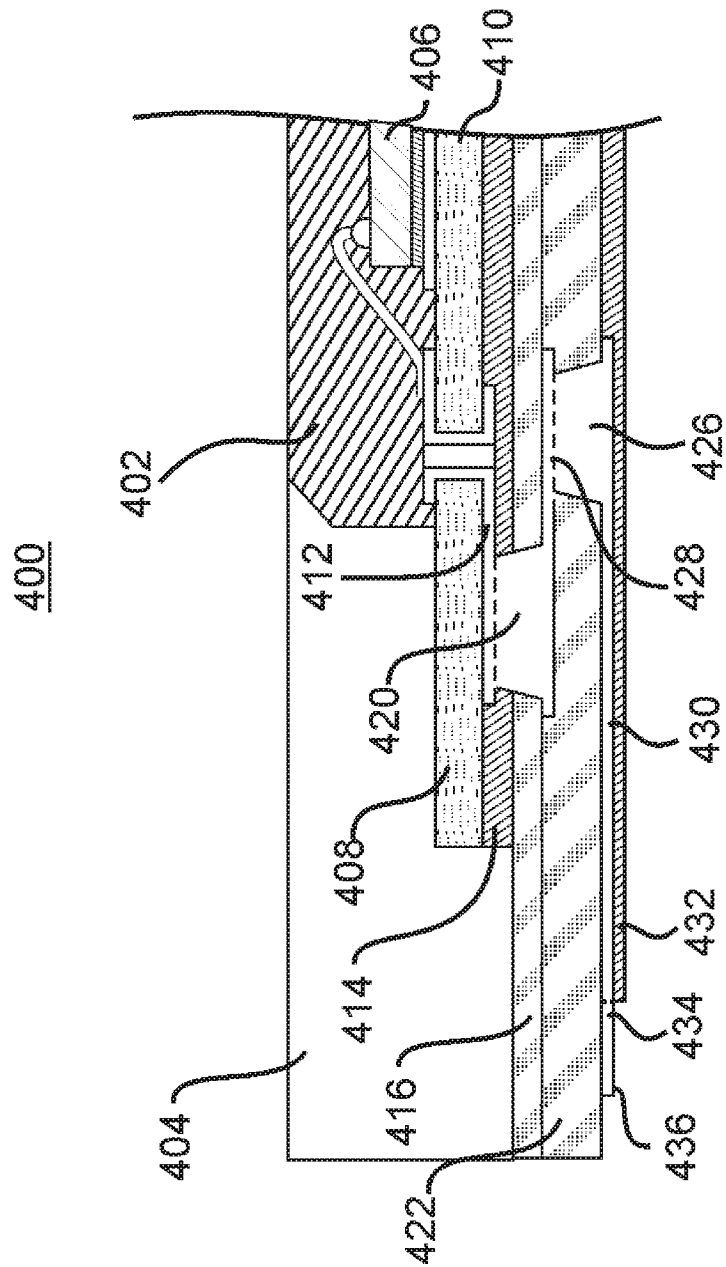
FIG. 4 is a cross-sectional view of a portion of a RIP assembly employing a LGA component.

FIG. 4, an apparatus 400 illustrative of the present invention, shows a LGA component package (402, 406, 408, 410, 412, 414) mounted on a substrate 416 which does not have to be a PCB. It will be obvious to one skilled in the art that a BGA, gull wing or J-leaded component, or other IC package structure or any type of discrete component may substitute for the LGA component. The connection is simpler, solder free, and lower profile than the assemblies shown in FIGS. 1, 2, and 3.

Adhering to package 402 is electrically insulating material 404. Material 404 is shown attached to 1 side of package 402. However, material 404 may be attached to 2 sides of package 402, more than 2 sides of package 402, or may in fact envelop package 402. As applied, material 404 may give the apparatus strength, stability, structural integrity, toughness (i.e., it is non-brittle), and dimensional stability. Material 404 may be reinforced by the inclusion of a suitable material such as a glass cloth.

Component package 402 contains electrical component 406 (such as an IC, discrete, or analog device; collectively referred to as "component" in this application including claims), supports 408 and 410 (preferably composed of organic or ceramic material), lead 412, and insulating material 414. While component package 402, as manufactured and shipped in many cases, incorporates insulating material 414, this legacy feature may potentially be eliminated in the future thus reducing the profile of the assembly 400. Either supports 408 and 410 or, if present, insulating material 414 sit on substrate 416 which is preferably made of insulating material. Some portion or all of substrate 416 may be made of electrically conductive material if it is desired to short leads (e.g., 412) extending from package 402.

Attachment of lead 412 to insulating material 414 and substrate 416 may be realized by adhesive dots as well as by other well known techniques.

A first set of vias, an example of which is via 420, extends through substrate 416, extends through insulating material 414, if present, reaches, and exposes leads such as lead 412. The vias 420 are plated or filled with an electrically conductive material (in many cases copper (Cu), although silver (Ag), gold (Au), or aluminum (Al) as well as other suitable materials, may be substituted). The plate or fill fuse with leads 412 forming an electrical and mechanical bond.

The substrate 416 may include a pattern mask (not shown) which is plated, or the plate or fill introduced into the first set of vias (e.g., via 420) may extend under the substrate 416 and provide a required first set of traces. Other traces may be created. A layer 422, also of insulating material, may underlay substrate 416 and first traces. The purpose of 422 is to provide a platform for a second set of traces (if required) and to electrically insulate the first set of traces from the second set of traces.

A second set of vias, an example of which is via 426, extends through layer 422, reaches, and exposes traces and/or leads (e.g., lead 428) under substrate 416. As discussed above, referring to the first set of vias (e.g., via 420), the second set of vias may be plated or filled so that they fuse with desired leads (e.g., lead 428) under substrate 416. As above, one or more traces 430 may extend under layer 422.

This layering continues as needed. By repeating the above structure, multiple layers (not shown), and additional traces and vias may be built. A surface insulating material 432 undercoats the last layer of circuits to protect them from shorting or physical damage. Leads or electrical connectors (e.g., lead 434) may extend beyond the surface insulating material 432. This provides contact surfaces (e.g., surface 436) to permit connection with other electrical components or circuit boards.

Figure 5:
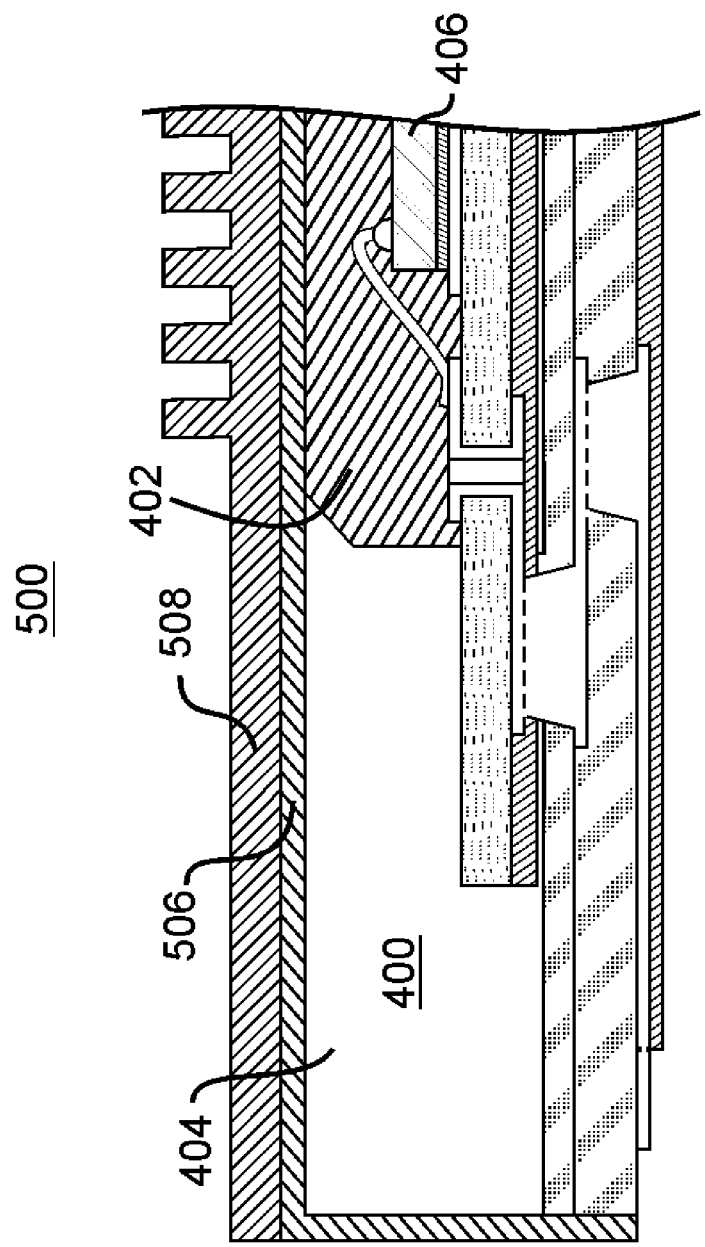
FIG. 5 is a cross-sectional view of a portion of a RIP assembly employing a LGA component with an optional heat spreader or heat pipe and heat sink.

FIG. 5, apparatus 500, shows optional heat dissipation features. Subassembly 400, previously described in FIG. 4, may have on top of the package 402 and material 404 a heat spreader or alternative heat pipe 506 and/or a heat sink 508 to dissipate heat generated by component 406. A thermal interface material (not shown) may be used to join the heat sink to the heat spreader. Optionally, material 404 may include in its composition a heat conductive (although electrically insulating) material such as silicon dioxide ($SiO_2$) or aluminum dioxide ($AlO_2$) to enhance heat flow from package 402. If heat spreader 506 and heat sink 508 are made of one or more substances well known in the art, they may provide electromagnetic interference (EMI) protection to the subassembly 400 and can help protect against static electricity build up and discharge.

Figure 6:
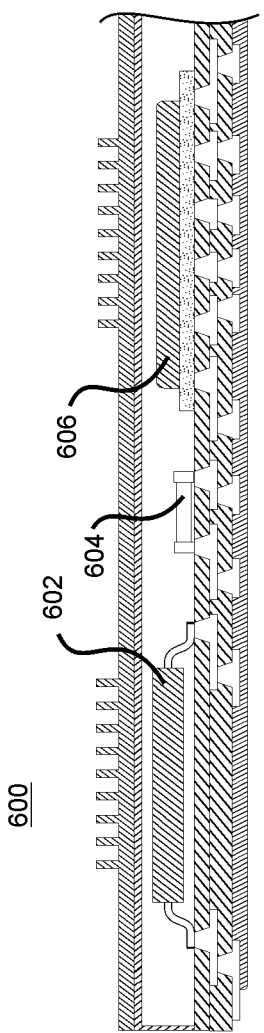
FIG. 6 is a cross-sectional view of a two layer RIP assembly showing mounted discrete, analog, and LGA components.

In accordance with a two layer RIP apparatus, a section of which is shown in FIG. 5, FIG. 6 shows apparatus 600 with a mounted sample set of components, including a discrete gull wing component 602, an analog component 604, and a LGA IC 606.

It will be apparent to someone skill in the art that the RIP apparatus is less complicated than a PCB containing soldered components. That is, just a PCB by itself is a complex device requiring dozens of steps to manufacture. The RIP apparatus, by not requiring a PCB board, is simpler, can provide more circuit routing space to reduce layer count, and requires fewer steps to manufacture a complete electronic assembly.

Figure 7:
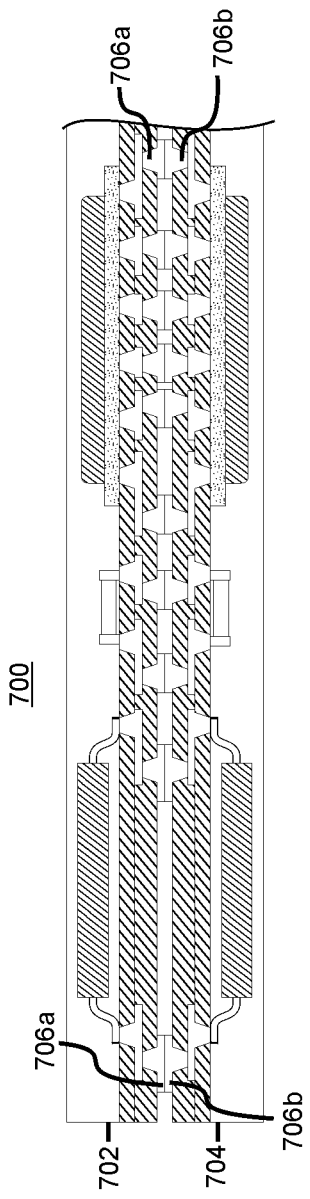
FIG. 7 is a cross-sectional view of a pair of mated two layer RIP subassemblies.

As an option, the FIG. 7 apparatus 700 shows two RIP subassemblies, 702 and 704, joined together at the plated and/or filled vias (e.g., 706a, 706b) and/or at the leads (e.g., 708a, 708b).

RIP Method of Manufacture

FIGS. 8 to 17 show a method of manufacture of a RIP assembly. It will be apparent to one skilled in the art that the sequence of steps may be varied without departing from the scope and spirit of this invention.

Figures 8, 9:
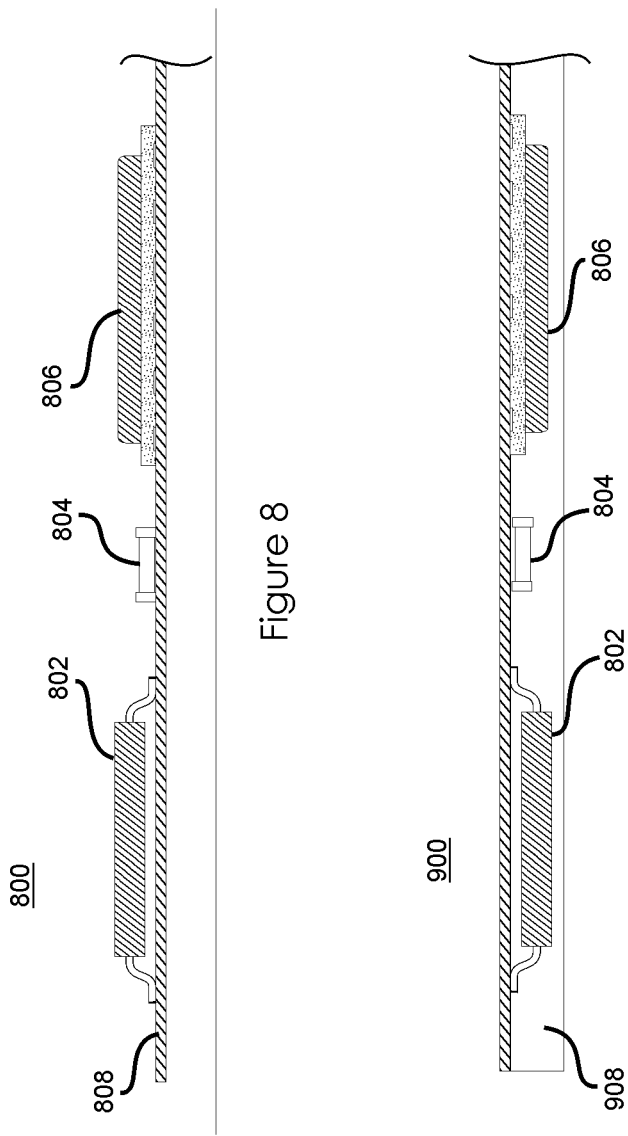
FIG. 8 is a cross-sectional view of a stage in the manufacture of a representative RIP assembly.
FIG. 9 is a cross-sectional view of a stage in the manufacture of a representative RIP assembly.

FIG. 8, stage 800, shows the initial mounting of packaged components, 802, 804, and 806 on a substrate 808. The components may be held in place by a number of different techniques and/or substances well known in the art including applying spot or conductive adhesive or by bonding to a tacky film of component leads to substrate 808. The material for applying or bonding may be suitable for holding and later releasing the components.

FIG. 9, stage 900, shows another step in the RIP method of manufacture. At this stage, the partial apparatus of FIG. 8 is flipped. The initially mounted packaged components 802, 804, and 806 are encased in electrically insulating material 908. Material 908 provides support for packaged components 802, 804, and 806 as well as electrical insulation from each other. If material 908 contains heat conductive, but electrically insulating matter, such as $AlO_2$ or $SiO_2$, it will also aid in dissipating heat.

Figure 10:
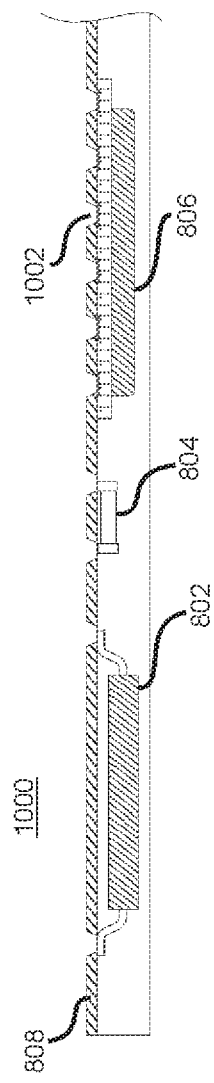
FIG. 10 is a cross-sectional view of a stage in the manufacture of a representative RIP assembly.

FIG. 10, stage 1000, shows another step in the RIP method of manufacture. Vias (e.g., 1002) through substrate 808 are created, reaching and exposing leads of packaged components 802, 804, and 806. Vias (e.g., 1002) may be formed or drilled (collectively referred to as "formed" in this application including claims) by any number of known techniques including laser drilling.

Figure 11:
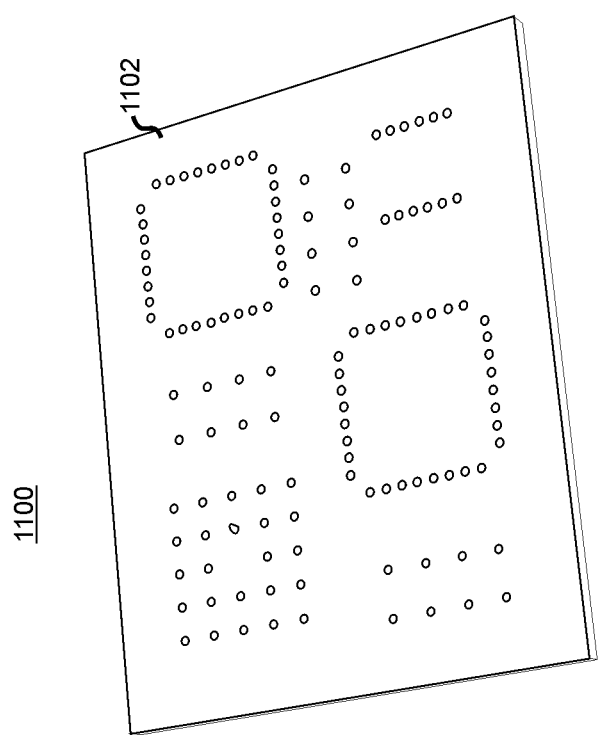
FIG. 11 is a perspective representation of a RIP subassembly.

FIG. 11, partial assembly 1100, as shown at the completion of stage 1000, is a perspective view of a top side of substrate 808 showing vias (e.g., 1102).

Figure 12:
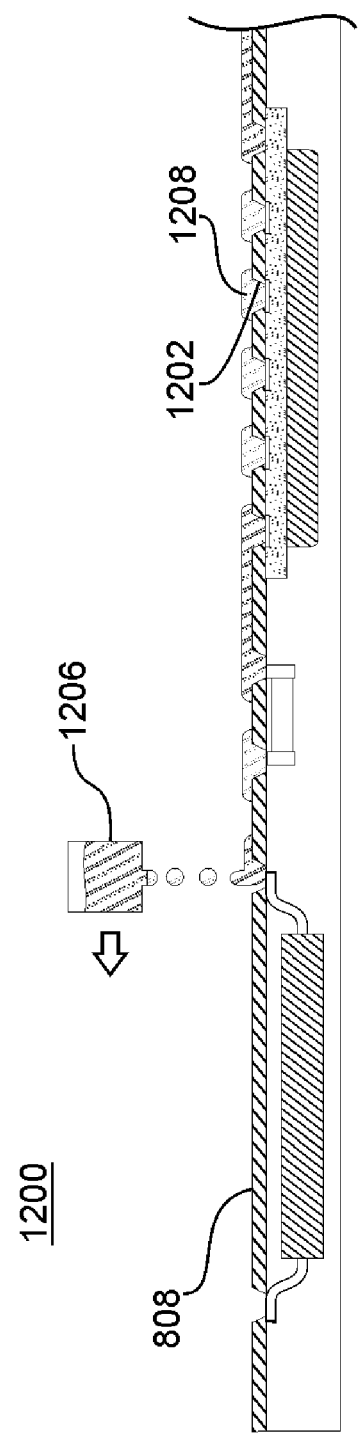
FIG. 12 is a cross-sectional view of a stage in the manufacture of a representative RIP assembly.

FIG. 12, stage 1200, illustrates how direct printing of circuits can be achieved. Vias (e.g., 1202) may be plated or filled with electrically conductive material and traces and leads (e.g., 1208) on substrate 808 may be created by device 1206. Using any number of techniques well known in the art, device 1206 may fill vias 1202, print leads and traces 1208, and/or plate leads and traces 1208 onto substrate 808.

Figure 13:
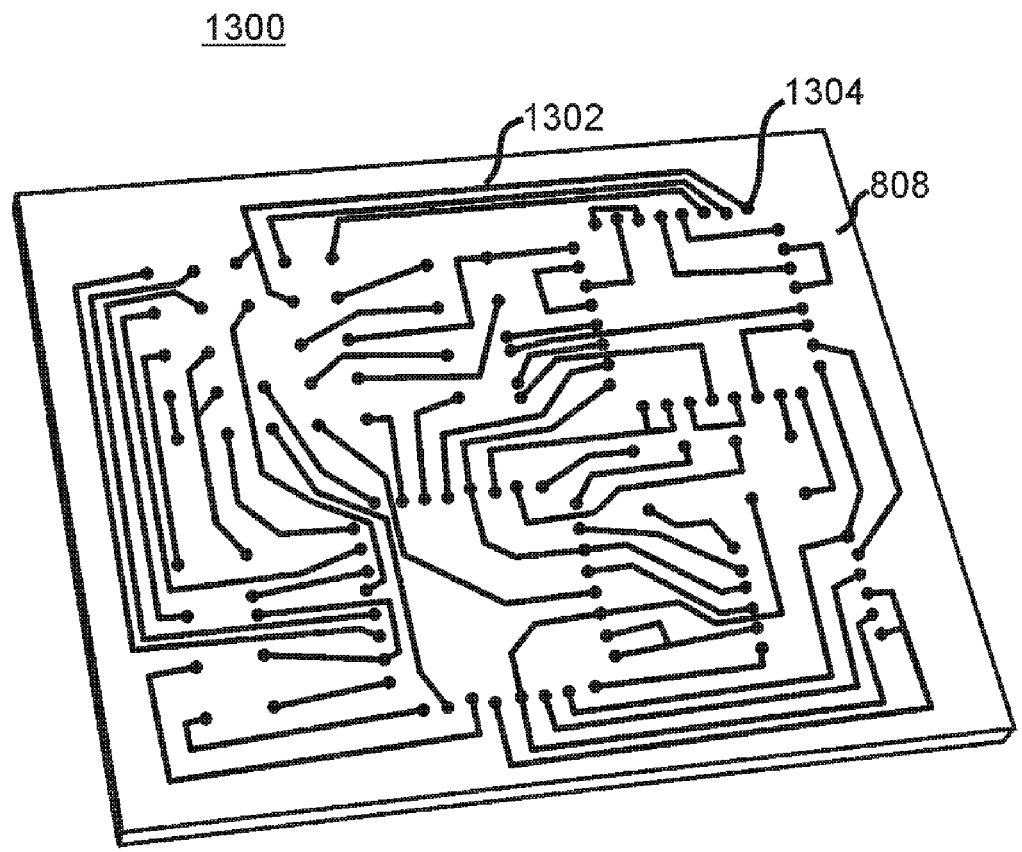
FIG. 13 is a perspective representation of a RIP subassembly.

Traces (e.g., 1302) and leads (e.g. 1304), created in accordance with stage 1200 on substrate 808, are shown in perspective view in FIG. 13, partial apparatus 1300.

Figure 14:
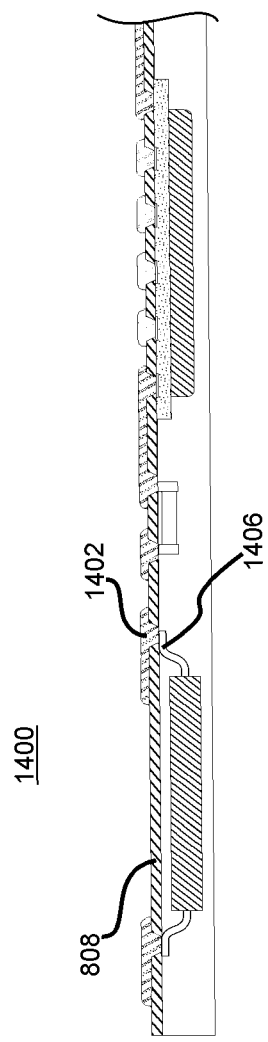
FIG. 14 is a cross-sectional view of a side drawing of a RIP subassembly.

Partial apparatus 1400, created in accordance with stage 1200 is shown in side view in FIG. 14. Filled vias (e.g., via 1402) are shown extending through substrate 808 to component leads (e.g., lead 1406).

Figure 15:
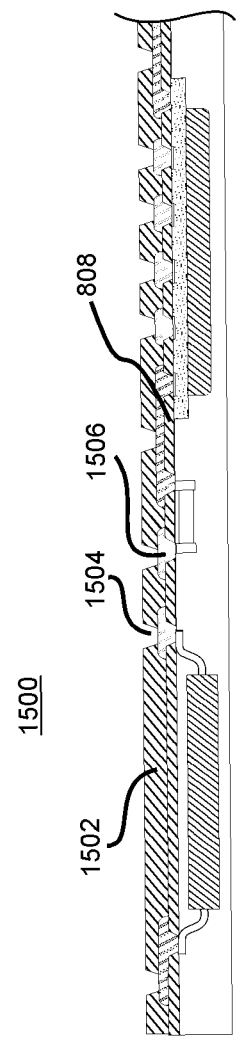
FIG. 15 is a cross-sectional view of a stage in the manufacture of a representative RIP subassembly.

In FIG. 15, showing stage 1500, a layer of insulating material 1502 and a second set of vias (e.g. via 1504) are formed on top of substrate 808. The vias extend to and expose leads (e.g., 1506) on top of substrate 808.

Figure 16:
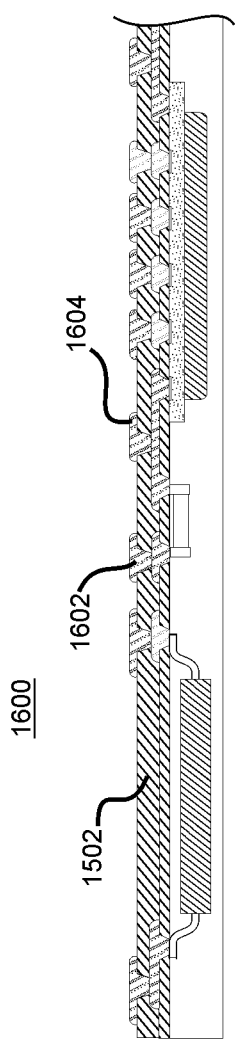
FIG. 16 is a cross-sectional view of a stage in the manufacture of a representative RIP subassembly.

As shown in FIG. 16, at any convenient time, the subassembly may be inverted. In FIG. 16, a stage showing creation of subassembly 1600, plating and/or filling the second set of vias (e.g., 1602) and making traces (e.g., 1604) are completed under layer 1502.

Figure 17:
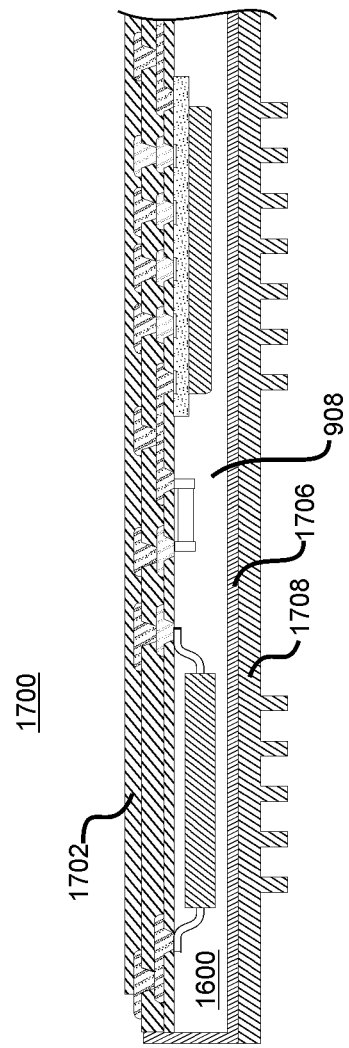
FIG. 17 is a cross-sectional view of a stage in the manufacture of a representative RIP subassembly.

In this manner, additional layers may be built up. Eventually, as shown in FIG. 17 for a two layer subassembly 1700, insulating material 1702 is laid under the bottom layer of subassembly 1600.

Figure 18:
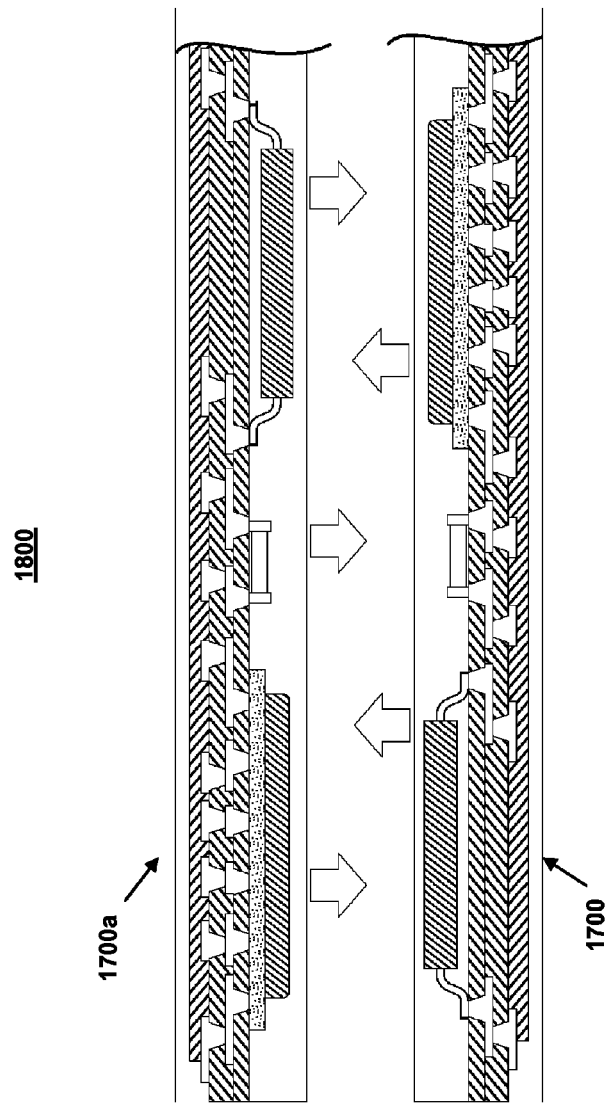
FIG. 18 is a cross-sectional view showing a process for mating two RIP subassemblies.
Figure 19:
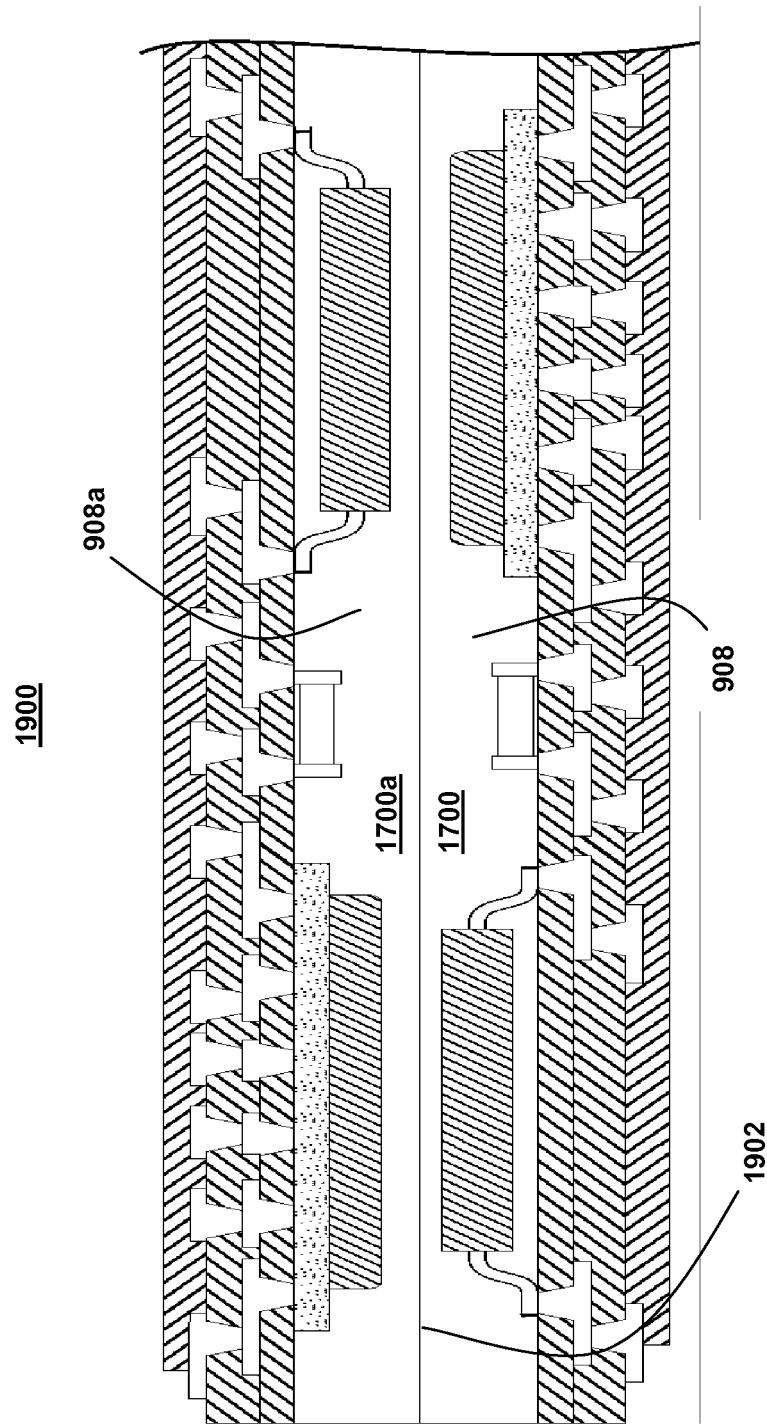
FIG. 19 is a cross-sectional view of a completed mated RIP assembly.

As shown in FIG. 18, stage 1800, upon the creation of RIP subassembly 1700, and a second RIP subassembly 1700a, the two subassemblies may be mated. RIP subassemblies may be created as functional electronic blocks which can be joined to create a new or different function as a system or subsystem. FIG. 19 shows a completed mating of subassembly 1700 and subassembly 1700a to form apparatus 1900. The insulating material 908 for subassembly 1700 and equivalent insulating material 908a for subassembly 1700a may be joined in any number of known techniques in the art including a layer of adhesive 1902 as well as heat fusion, friction fusion, or chemical fusion.

As noted above, the sequence of steps may be varied without departing from the scope and spirit of this invention. For example in FIG. 20, an RIP subassembly 2000 may be built by deferring or eliminating the application of insulating material (see FIG. 9, insulating material 908).

Deferring the application of insulating material allows for an alternate process of injection molding, as shown in FIG. 21, stage 2100. In this stage, subassembly 2000 and a second subassembly 2000a are mated. Then a device 2102, well known in the art, injects electrically insulating material 908b in spaces between subassembly 2000 and subassembly 2000a.

Whether RIP subassemblies are created with insulating material placed early in the process (e.g. FIG. 9, insulating material 908) or placed at a later point in the process (e.g. FIG. 21, insulating material 908b), the RIP configuration permits various types of electrical connections between one or more layers of one subassembly and one or more layers of a second subassembly.

Figure 22:
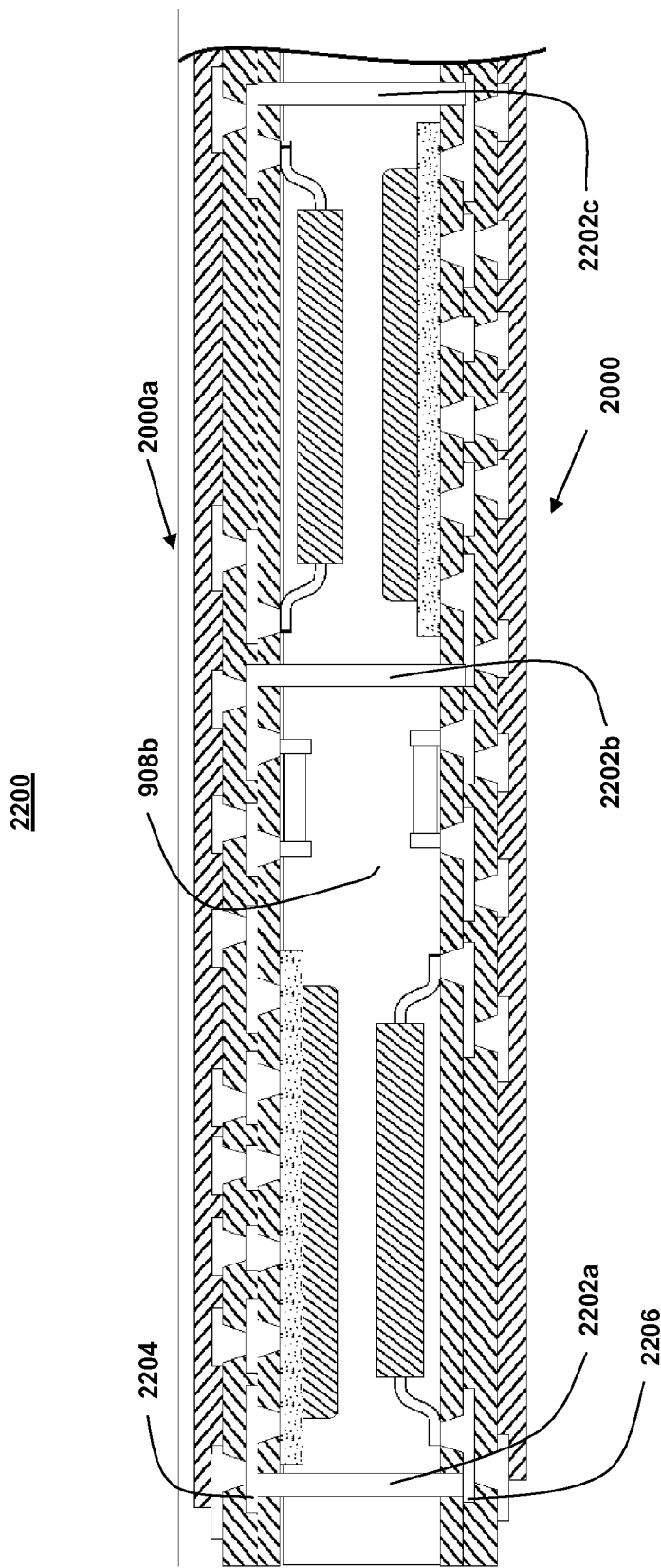
FIG. 22 is a cross-sectional view of mated RIP subassemblies with optional pins.

For example, in FIG. 22, assembly 2200 is the mated pair of RIP subassemblies 2000 and 2000a. A suitable electrically insulating material 908b is between the subassemblies 2000 and 2000a. Pins 2202a, 2202b, and 2202c make electrical and/or physical connections between traces (e.g. 2204 and 2206) from subassembly 2000 to subassembly 2000a.

Figure 23:
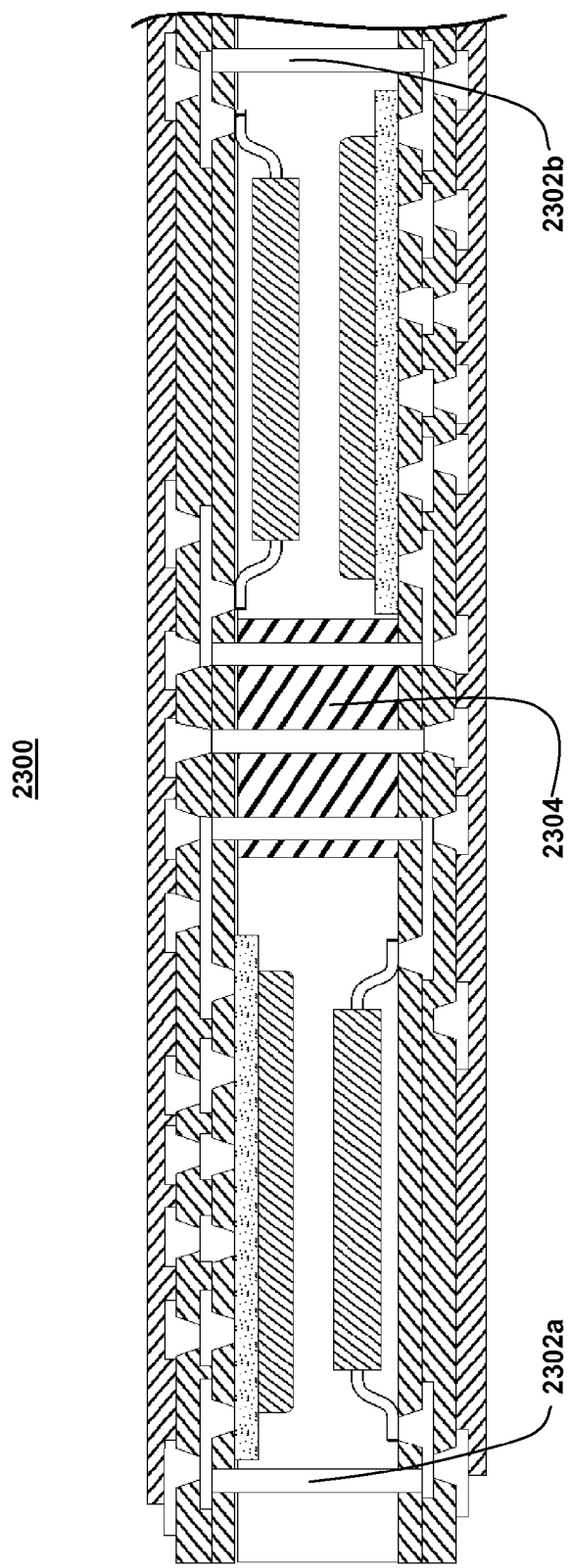
FIG. 23 is a cross-sectional view of mated RIP subassemblies with optional pins and a mezzanine multipath interconnection device.

Pins themselves may be configured tightly together in a mezzanine interconnection device. In FIG. 23, apparatus 2300 is two RIP mated subassemblies with connecting pins 2302a and 2302b. In addition, a mezzanine interconnection device 2304 is positioned between the two subassemblies. Mezzanine interconnection devices are discussed in further detail below (see FIGS. 31a, 31b, 31c, 32, and 33).

Figure 24:
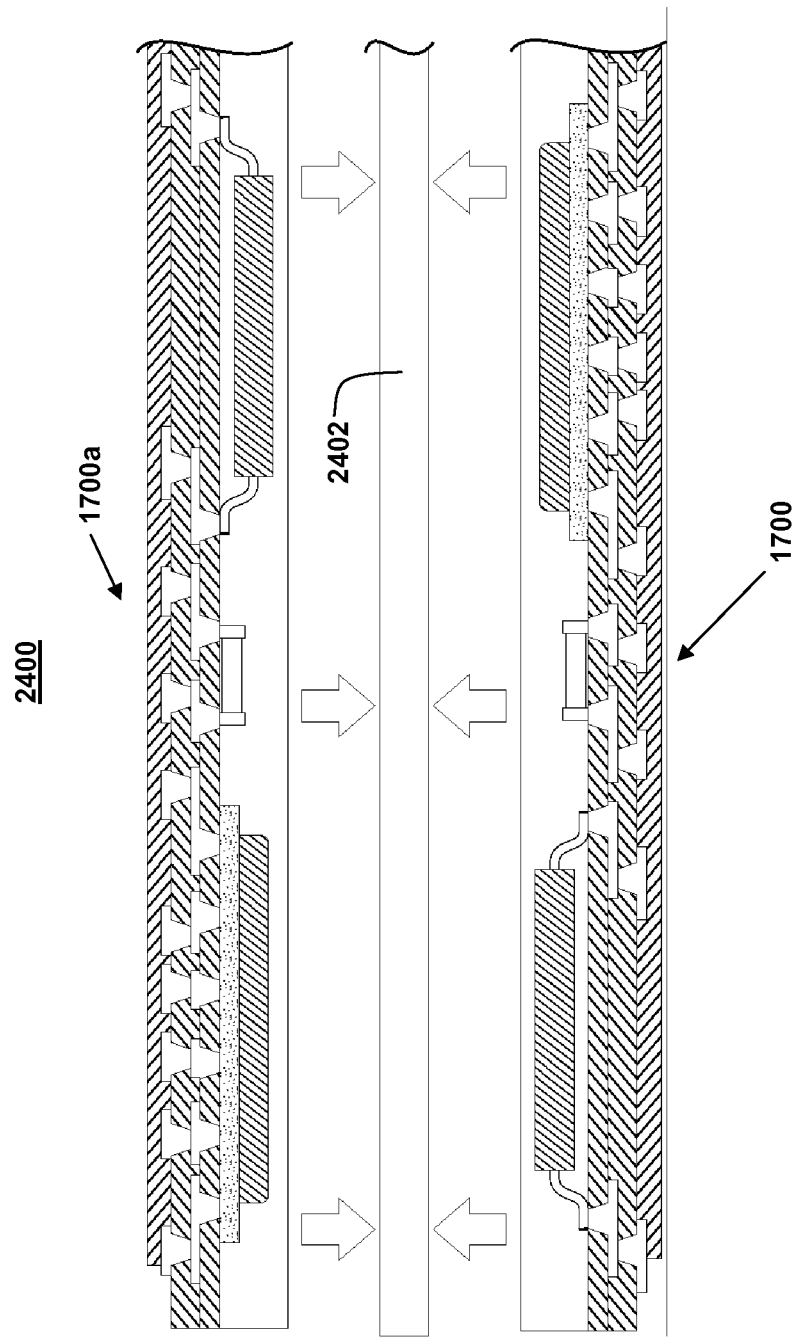
FIG. 24 is a cross-sectional view of a process of mating RIP subassemblies with an optional heat spreader.
Figure 25:
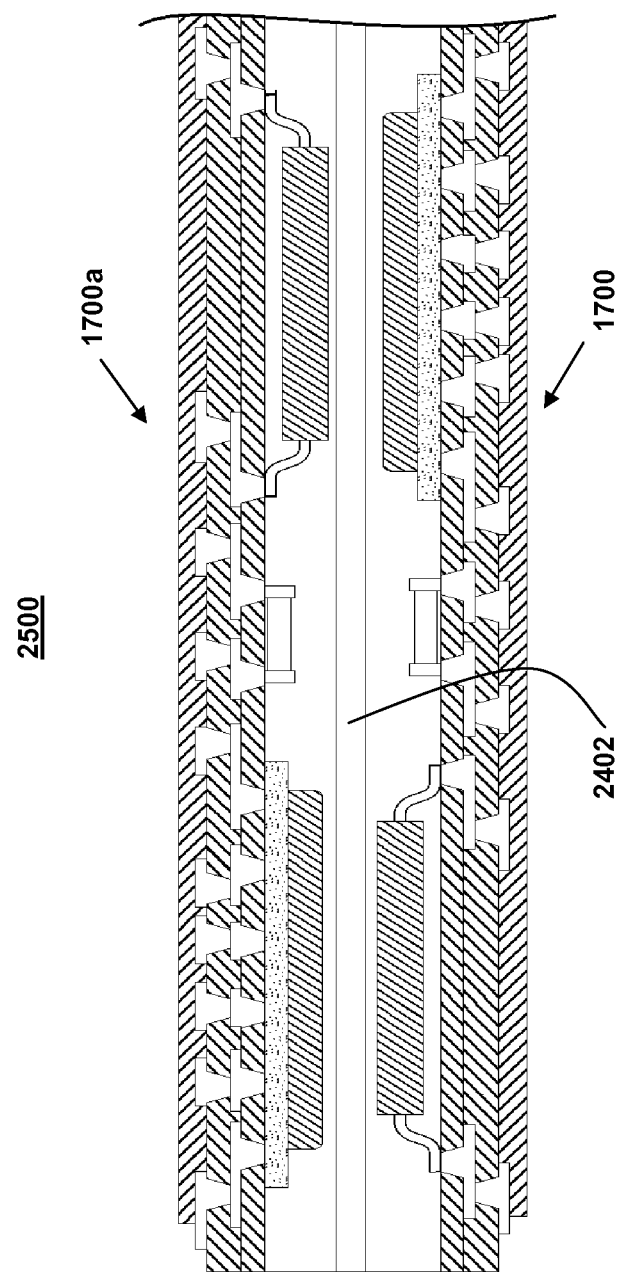
FIG. 25 is a cross-sectional view of mated RIP subassemblies with an optional heat spreader.

Because of the manner in which RIP subassemblies may be mated (i.e., back to back), other objects may be inserted. In FIG. 24, stage 2400 shows subassemblies 1700 and 1700a in the process of being mated with heat spreader 2402. FIG. 25 shows a completed assembly 2500 with heat spreader 2402 between subassemblies 1700 and 1700a.

Figure 26:
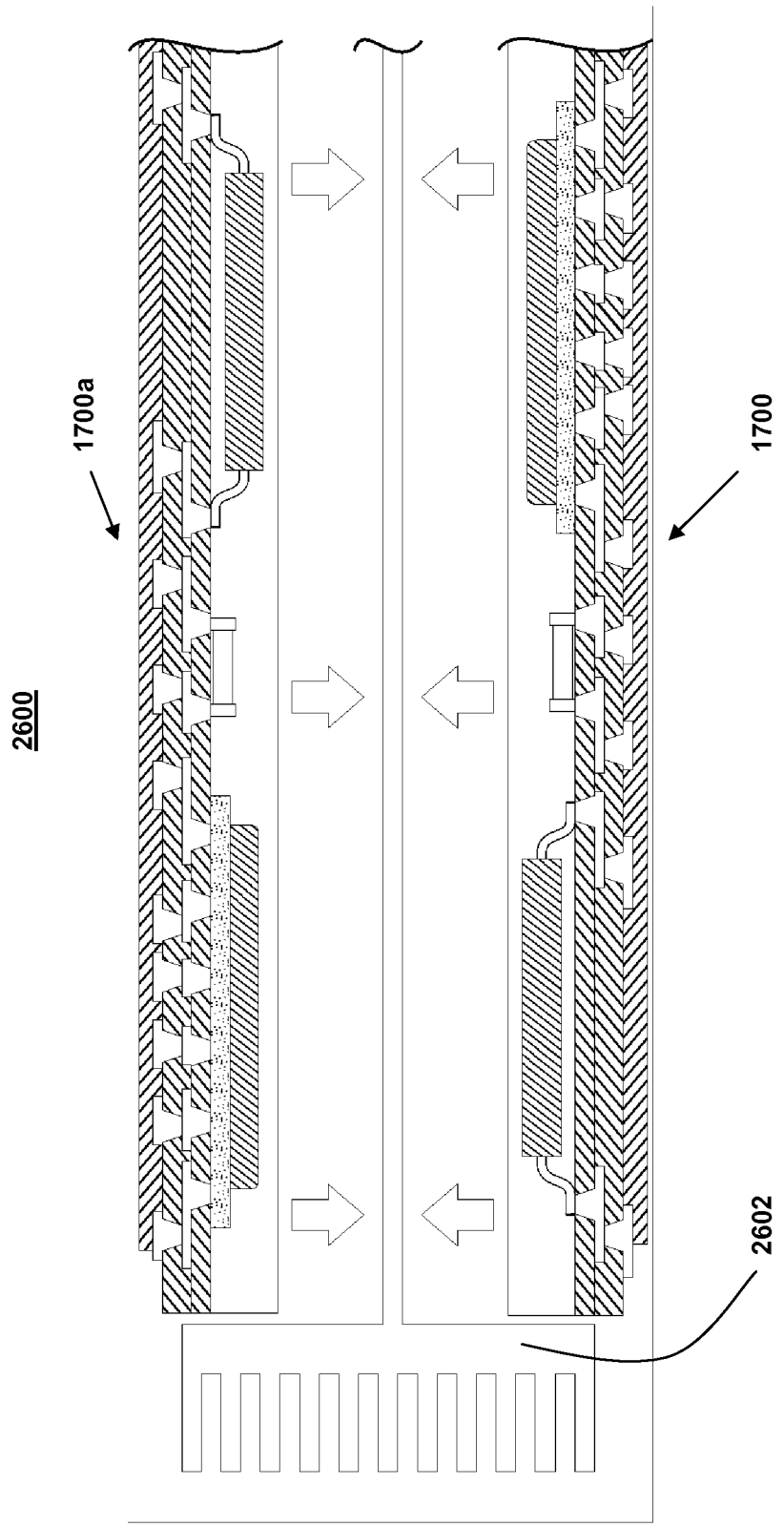
FIG. 26 is a cross-sectional view of a process of mating RIP subassemblies with an optional combination heat spreader, or heat pipe, and heat sink.
Figure 27:
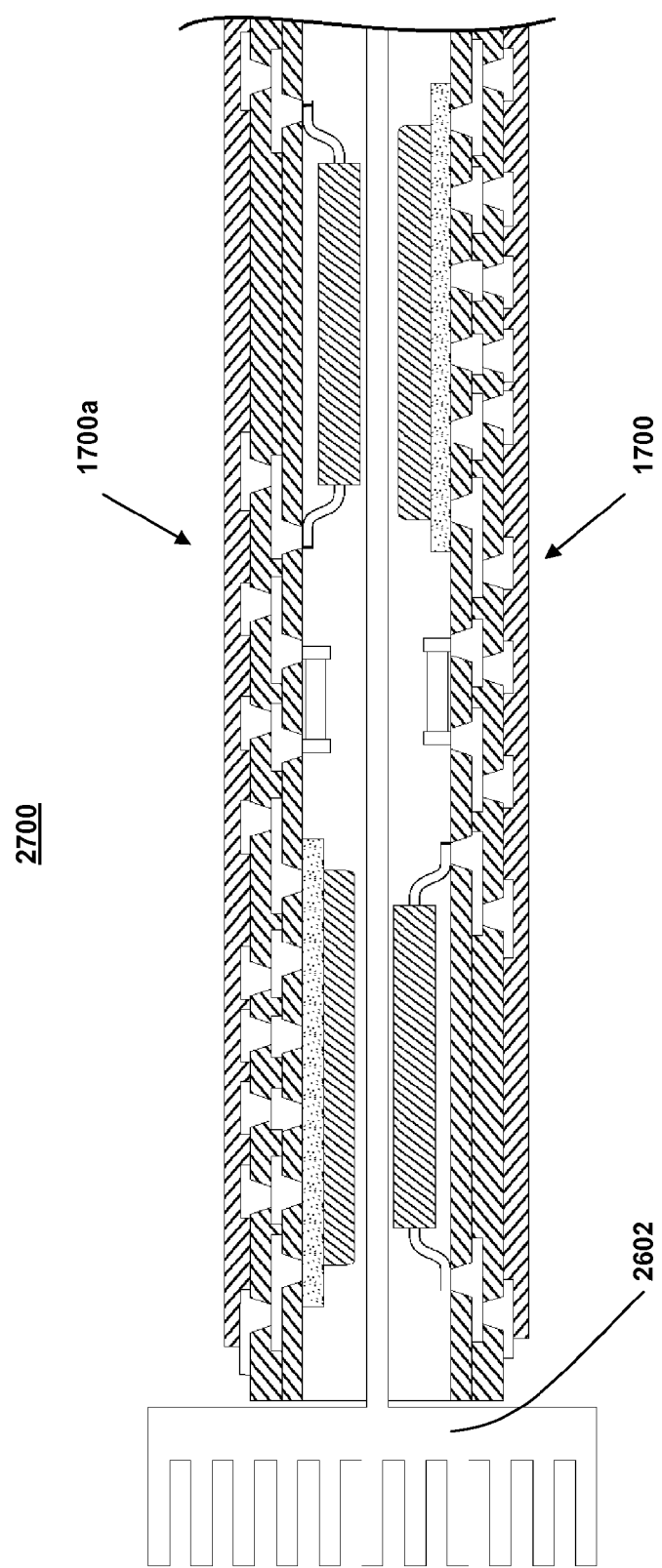
FIG. 27 is a cross-sectional view of mated RIP subassemblies with an optional combination heat spreader, or heat pipe, and heat sink.

In a similar manner, a combination heat spreader and heat sink may be inserted. FIG. 26, stage 2600 shows subassemblies 1700 and 1700a in the process of being mated with combination heat spreader and heat sink 2602. FIG. 27 shows a completed assembly 2700 with combination heat spreader and heat sink 2602 between subassemblies 1700 and 1700a.

Figure 28:
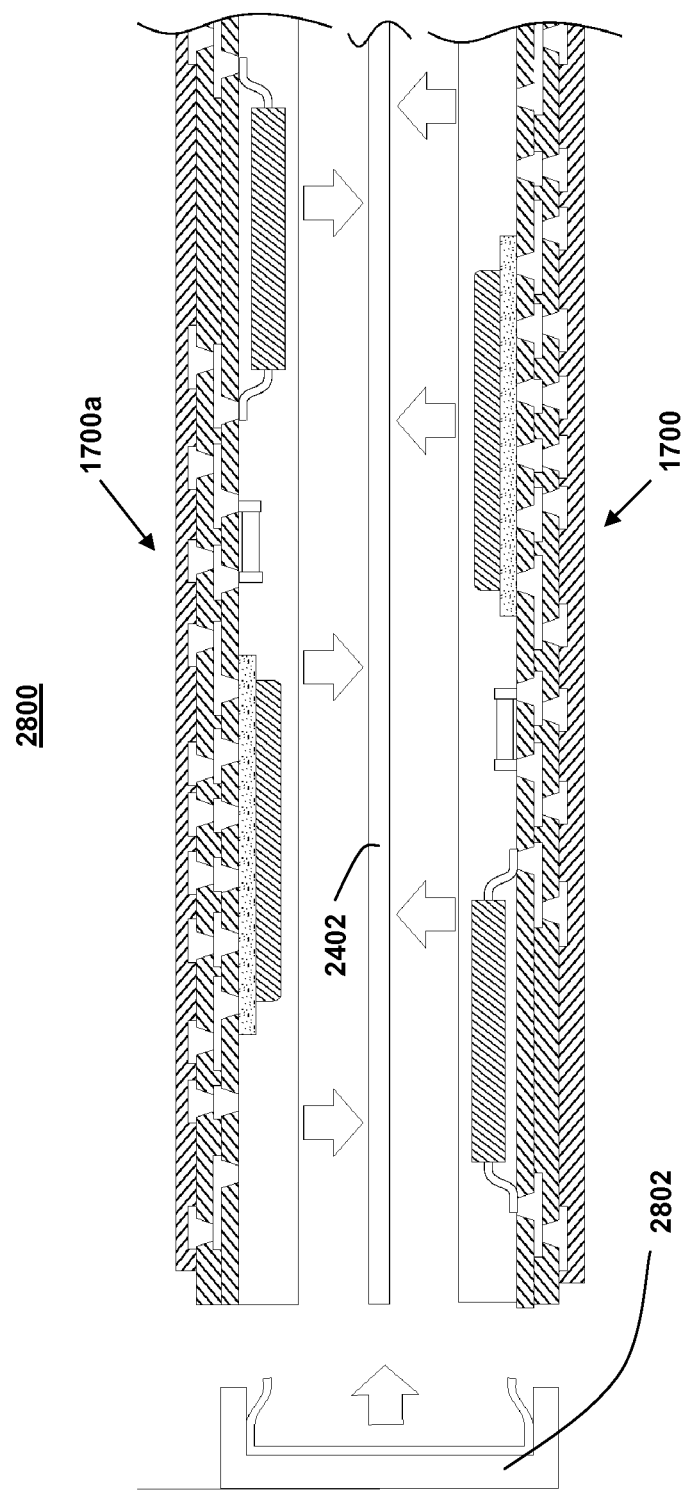
FIG. 28 is a cross-sectional view of a process of mating RIP subassemblies with an optional edge card connector.
Figure 29:
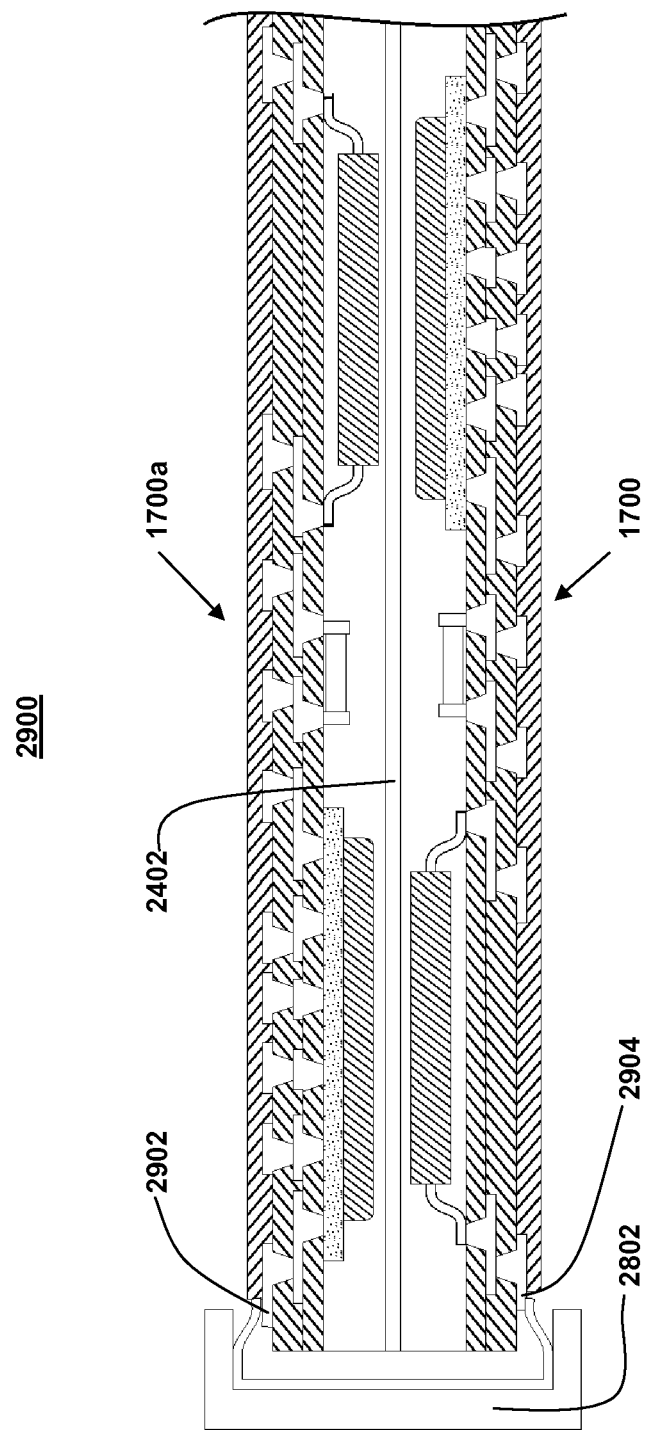
FIG. 29 is a cross-sectional view of mated RIP subassemblies with an optional edge card connector.

Various combinations of objects may be combined with RIP subassemblies. In FIG. 28, stage 2800 shows subassemblies 1700 and 1700a in the process of being mated with heat spreader 2402 and edge connector 2802. FIG. 29 shows a completed assembly 2900 with heat spreader 2402 between subassemblies 1700 and 1700a in combination with edge connector 2802 in contact with traces 2902 and 2904.

Figure 30:
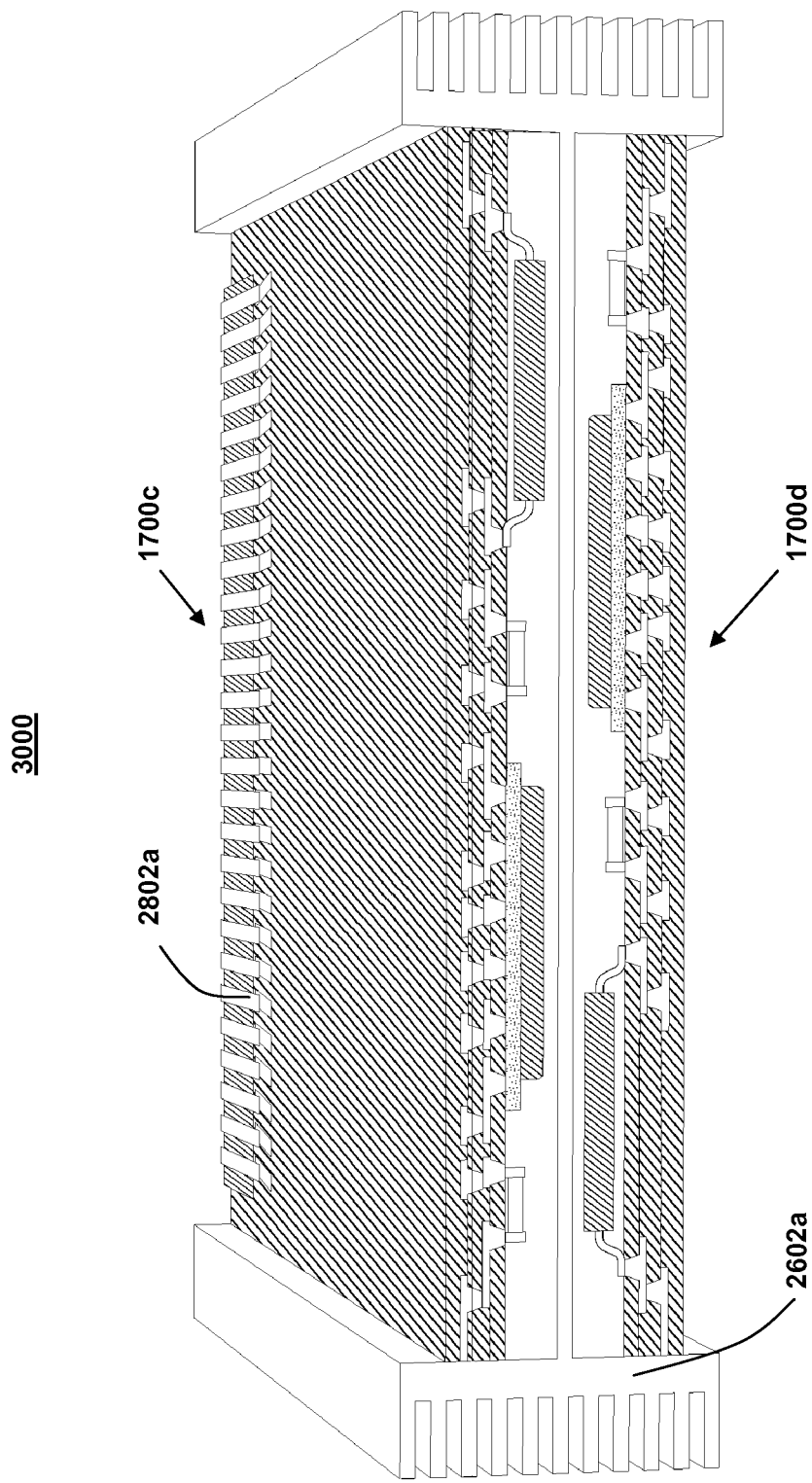
FIG. 30 is a perspective view of a section of mated RIP subassemblies with an optional combination heat spreader, or heat pipe, and heat sink, and an optional edge card connector.

FIG. 30 is a perspective view of assembly 3000. RIP subassemblies 1700c and 1700d are mated with combination heat spreader and heat sink 2602a. In the same apparatus, edge card connector 2802a is in contact with assembly 3000 traces (not shown).

Figure 31A:
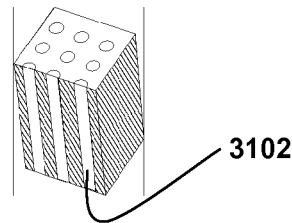
FIGS. 31a, 31b, and 31c are examples of types of mezzanine interconnection devices compatible with the present invention.
Figure 31B:
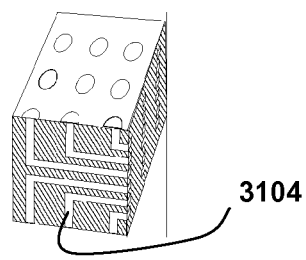
Figure 31C:
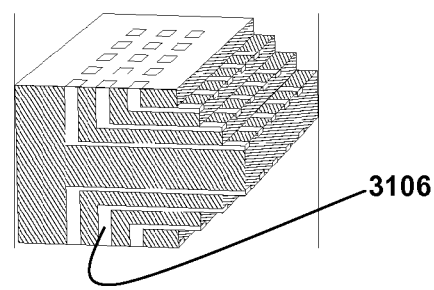

FIGS. 31a, 31b, and 31c are examples of types of mezzanine interconnection devices compatible with the present invention. Referring to FIG. 23, mezzanine interconnection devices may electronically connect traces between two separate RIP mated subassemblies. In FIG. 31a, mezzanine interconnection device 3100a is a perspective view of a cut away mezzanine interconnection device. Conductive pins (e.g., 3102) are embedded in an electronically insulating material. FIG. 31b, also shows a mezzanine interconnection device 3100b with embedded pins (e.g., 3104). In this instance, the conductive pins are angled. This is useful, for example for edge connections. Also, while not shown, at least one row of pins may be substituted with a metal plate to either improve shielding between rows of pins or provide for improved or enhanced signal integrity. The plate may be perforated to improve the assembly's physical integrity. FIG. 31c, shows a mezzanine interconnection device 3100c also with angled embedded pins (e.g. 3106). In this instance, the edge of the mezzanine interconnection device where conductive pins emerge is stepped. This permits connections to particular types of edge cards.

Figure 32:
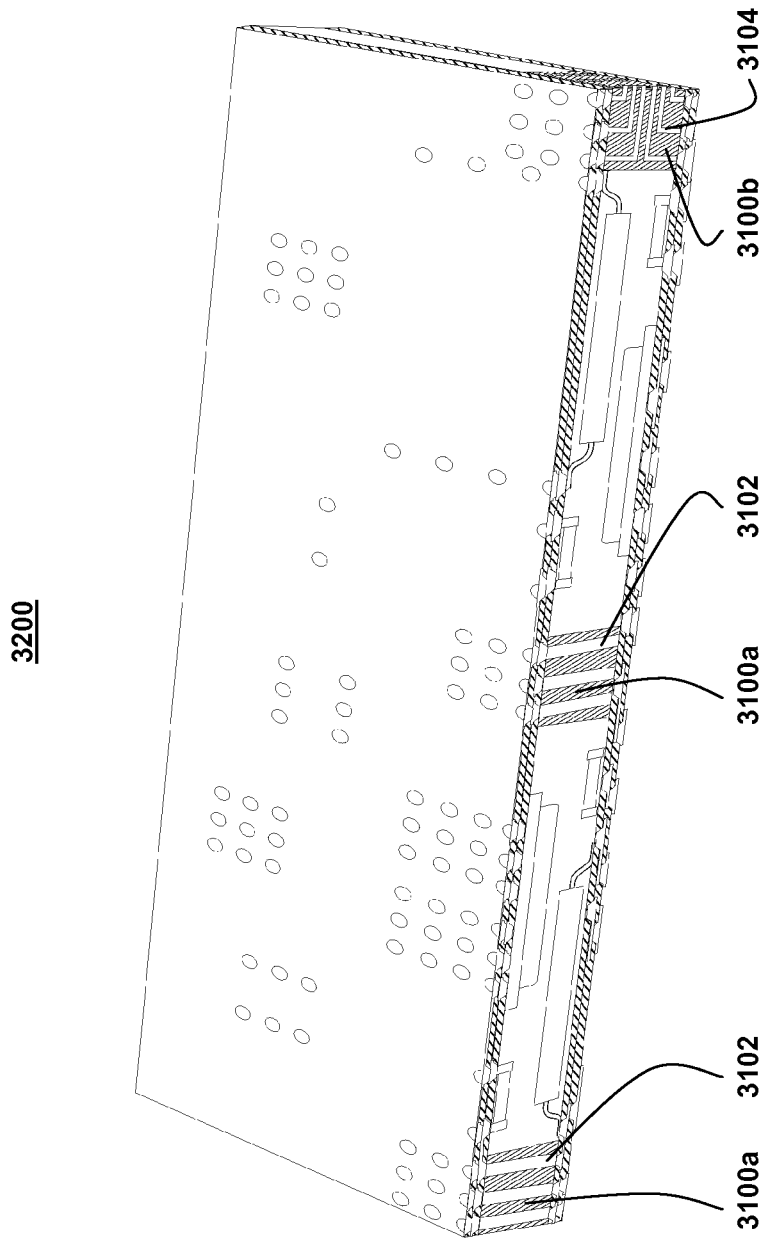
FIG. 32 is a perspective view of a section of mated RIP subassemblies with embedded mezzanine interconnection devices.

FIG. 32, shows a perspective cut-away view of mated partially completed RIP subassemblies. The vias for a second layer have been completed but they have not yet been filled and traces have not yet been plated. This view is another example of how the order of steps in the process of creating assemblies may be varied. Partial apparatus 3200 contains mezzanine interconnection devices 3100a, and 3100b. The mezzanine interconnection devices 3100a electrically connect layers (e.g., by pins such as 3102) in apparatus 3200 while mezzanine interconnection device 3100b route electrical signals from the layers (e.g., by pins such as 3104) to an edge of partial apparatus 3200.

Figure 33:
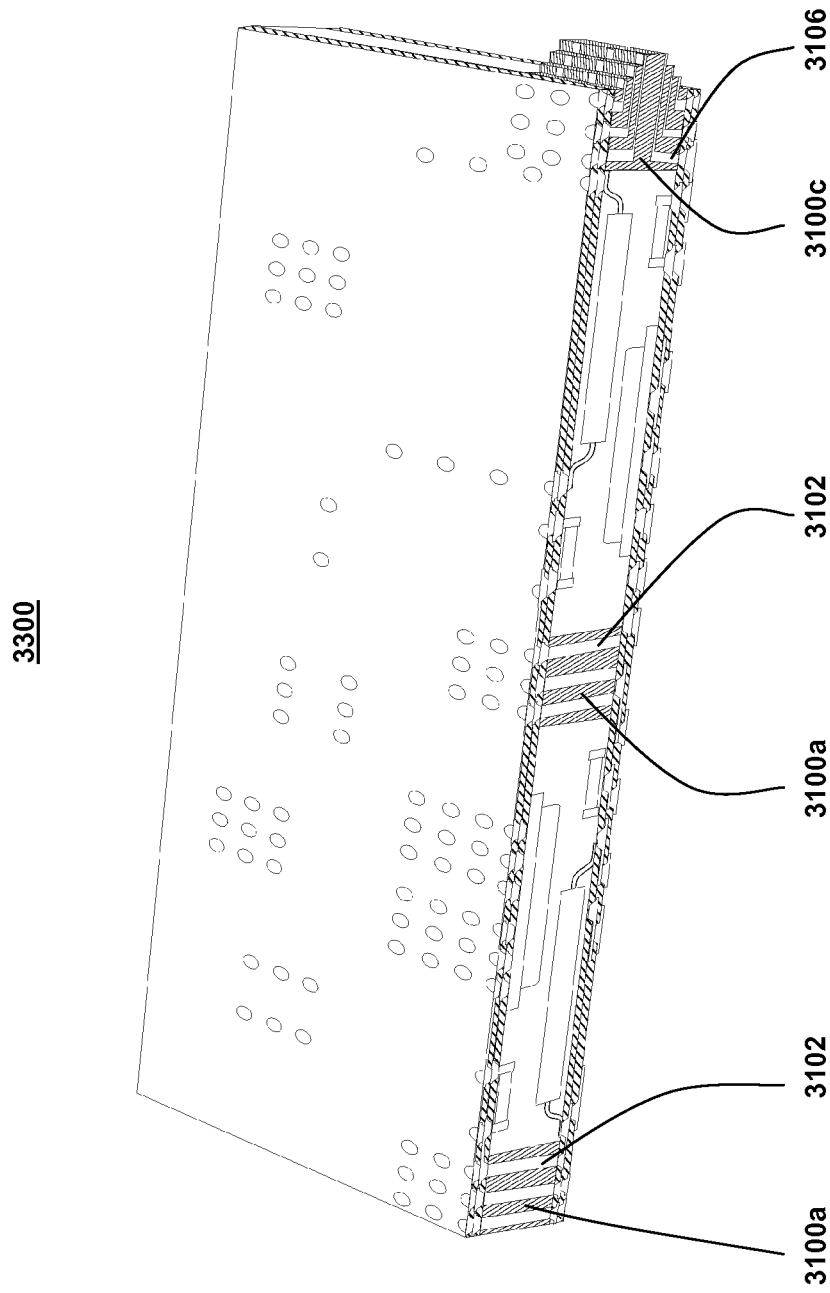
FIG. 33 is a perspective view of a section of mated RIP subassemblies with embedded mezzanine interconnected devices.

In FIG. 33, partially completed RIP apparatus 3300, as in FIG. 32 apparatus 3200, contains mezzanine interconnection devices 3100a, electrically connecting layers (e.g., by pins 3102). Mezzanine interconnection device 3100c, with a stepped edge, routes electrical signals from the layers (e.g., by pins 3102) to an edge of partial apparatus 3300. This enables an edge connector (not shown) to be attached to a completed mated RIP apparatus.

While the particular system, apparatus, and method for ELECTRONIC ASSEMBLIES WITHOUT SOLDER as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular means "at least one". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

I claim:

1. A circuit assembly comprising: a first RIP subassembly and a second RIP subassembly, each having a contact surface, wherein the contact surface of the first RIP subassembly is attached to the contact surface of the second RIP subassembly with a connective; wherein an RIP subassembly comprise:
    a substrate having an electrically conductive via;
    a circuit formed on one side of the substrate; the circuit connected to the via;
    a component, having a lead, attached to the other side of the substrate the lead connected to the via; and
    a encapsulent covering the component and attaching it to the other side of the substrate, the encapsulent havinq no vias communicating with said lead, the encapsulent comprising a contact surface.

2. The circuit assembly of claim 1 wherein the connective is an adhesive.

3. The circuit assembly of claim 1 wherein the connective is fused encapsulent.

4. The circuit assembly of claim 1, wherein one or more pins connect the first RIP subassembly with the second subassembly.

5. The circuit assembly of claim 4, wherein one or more pins physically connect subassembly with subassembly.

6. The circuit assembly of claim 1, wherein one or more mezzanine interconnection devices electrically connect the first RIP subassembly with the second subassembly.

7. The circuit assembly of claim 6 wherein at least one of the one or more mezzanine interconnection devices comprises angled pins.

8. The circuit assembly of claim 7 wherein at least one of the one or more mezzanine interconnection devices comprises angled pins and one or more stepped edges.

9. The circuit assembly of claim 1, wherein the connective comprises a heat spreader.

10. The circuit assembly of claim 1, wherein the connective comprises a combination heat sink.

11. The circuit assembly of claim 1, wherein the connective comprises a heat sink and an edge connector is attached to the heat sink.

12. The circuit assembly of claim 1, wherein the connective comprises heat sink and an edge connector is attached to the circuit of each RIP assembly.

* * * * *